(12) United States Patent  (10) Patent No.: US 8,154,290 B2
Tanaka et al.  (45) Date of Patent: Apr. 10, 2012

(54) NMR SOLENOIDAL COIL AND NMR PROBE HAVING SPECIALIZED STATIC MAGNETIC FIELD COMPENSATING ARRANGEMENTS

(75) Inventors: Hideki Tanaka, Hitachinaka (JP); Mitsuyoshi Tsuchiya, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 1243 days.

(21) Appl. No.: 11/836,867

(22) Filed: Aug. 10, 2007

(65) Prior Publication Data

US 2008/0074221 A1  Mar. 27, 2008

(30) Foreign Application Priority Data

Sep. 27, 2006  (JP) ................................ 2006-262427

(51) Int. Cl.
*G01V 3/00* (2006.01)
(52) U.S. Cl. ...................................................... 324/318
(58) Field of Classification Search ........... 324/300–322
See application file for complete search history.

(56) References Cited

U.S. PATENT DOCUMENTS

| | | | | |
|---|---|---|---|---|
| 4,590,427 A * | 5/1986 | Fukushima et al. | ........... | 324/318 |
| 4,812,797 A * | 3/1989 | Jayakumar | ..................... | 335/299 |
| 4,829,252 A * | 5/1989 | Kaufman | ...................... | 324/309 |
| 4,943,774 A * | 7/1990 | Breneman et al. | ............. | 324/318 |
| 5,124,651 A * | 6/1992 | Danby et al. | ..................... | 324/318 |
| 5,134,374 A * | 7/1992 | Breneman et al. | ............. | 324/319 |
| 5,194,810 A * | 3/1993 | Breneman et al. | ............. | 324/319 |
| 5,701,112 A * | 12/1997 | Brown | ........................... | 335/216 |
| 5,736,859 A * | 4/1998 | Gore | ............................. | 324/319 |
| 6,163,154 A * | 12/2000 | Anderson et al. | ............. | 324/320 |
| 6,249,121 B1 * | 6/2001 | Boskamp et al. | .............. | 324/318 |
| 6,294,972 B1 * | 9/2001 | Jesmanowicz et al. | ........ | 335/301 |
| 6,335,670 B1 * | 1/2002 | Kinanen | ........................ | 335/296 |
| 6,404,197 B1 * | 6/2002 | Anderson et al. | ............. | 324/311 |
| 6,437,568 B1 * | 8/2002 | Edelstein et al. | .............. | 324/318 |
| 6,538,545 B2 * | 3/2003 | Wakuda et al. | ................ | 335/296 |
| 6,556,012 B2 * | 4/2003 | Yamashita | ..................... | 324/318 |
| 6,700,378 B2 * | 3/2004 | Sato | ............................... | 324/318 |
| 6,707,359 B2 * | 3/2004 | Yoshida et al. | ................ | 335/216 |
| 6,798,205 B2 * | 9/2004 | Bommel et al. | ............... | 324/319 |
| 6,836,119 B2 * | 12/2004 | DeMeester et al. | ........... | 324/320 |

(Continued)

FOREIGN PATENT DOCUMENTS

JP  06-88863  3/1994

(Continued)

*Primary Examiner* — Dixomara Vargas
(74) *Attorney, Agent, or Firm* — Antonelli, Terry, Stout & Kraus, LLP.

(57) ABSTRACT

Solenoid coil arrangements for sending a high-frequency wave, receiving or sending and receiving in a measurement of an NMR signal, wherein the solenoid coil has at least two leader lines for connections to a resonance circuit. A static magnetic field compensating member is arranged outside of the leader lines and is at least one of: (a) arranged to extend a main solenoid coil in an axial direction, and not to generate a high-frequency magnetic field in a direction to cancel a high-frequency magnetic field generated by the main solenoid coil; (b) constituted by an insulant having a magnetic susceptibility of the same sign as a material of a main solenoid coil and is in an outer side in an axial direction of the main solenoid to contact with the main solenoid coil; and (c) constituted by ring-shaped members divided into a plurality of sections in a circumferential direction.

7 Claims, 4 Drawing Sheets

U.S. PATENT DOCUMENTS

| | | | |
|---|---|---|---|
| 6,847,279 B2 * | 1/2005 | Yoshida et al. | 335/301 |
| 6,861,933 B1 * | 3/2005 | Yoshida et al. | 335/301 |
| 6,954,068 B1 * | 10/2005 | Takamori et al. | 324/318 |
| 6,973,711 B1 * | 12/2005 | Damadian | 29/602.1 |
| 6,977,571 B1 * | 12/2005 | Hollis et al. | 335/216 |
| 7,034,537 B2 * | 4/2006 | Tsuda et al. | 324/320 |
| 7,071,693 B2 * | 7/2006 | Yasuhara | 324/319 |
| 7,157,912 B2 * | 1/2007 | Maki et al. | 324/320 |
| 7,224,167 B2 * | 5/2007 | Jarvis et al. | 324/318 |
| 7,253,624 B2 * | 8/2007 | Ariyoshi | 324/320 |
| 7,495,441 B2 * | 2/2009 | Amor et al. | 324/318 |
| 7,541,812 B2 * | 6/2009 | Nogami | 324/319 |
| 7,760,059 B2 * | 7/2010 | Higuchi | 335/306 |

FOREIGN PATENT DOCUMENTS

| | | |
|---|---|---|
| JP | 07-023923 | 1/1995 |

\* cited by examiner

NMR SOLENOIDAL COIL AND NMR PROBE HAVING SPECIALIZED STATIC MAGNETIC FIELD COMPENSATING ARRANGEMENTS

BACKGROUND OF THE INVENTION

1. Field of the Invention

The present invention relates to a solenoid coil for an NMR signal and a probe for an NMR.

2. Description of Related Art

In the solenoid coil, a homogeneity of a static magnetic field is lowered in an outer side from a coil end. There has been known a structure for circulating an electric current in an inverse direction to a main solenoid or generating a magnetic field in an inverse direction to the main solenoid coil by arranging a cancel coil in an outer side in an axial direction of the main solenoid coil, in order to increase the homogeneity of the static magnetic field of the solenoid coil (for example, refer to patent document 1 (JP-A-7-23923 (abstract)).

The patent document 1 narrows a sensitive area so as to prevent a signal from being mixed from a space having a low homogeneity of the static magnetic field, by arranging the cancel coil, thereby circulating the electric current in the inverse direction to the main solenoid coil or generating the magnetic field in the inverse direction to the main solenoid coil. However, in accordance with this method, the sensitive area of the solenoid coil becomes narrow.

BRIEF SUMMARY OF THE INVENTION

An object of the present invention is to provide a solenoid coil in which a sensitive area is expanded by increasing a homogeneity of a static magnetic field in an outer side from a solenoid coil end so as to be capable of receiving a signal from a space in an outer side from the coil end, and a probe for an NMR in which the solenoid coil is mounted.

In accordance with the present invention, there is provided a solenoid coil used for sending a high-frequency wave, receiving or sending and receiving in a measurement of an NMR signal, wherein a static magnetic field compensating member is arranged in such a manner as to extend a main solenoid coil in an axial direction, and the static magnetic field compensating member is structured such as not to generate a high-frequency magnetic field in such a direction as to cancel a high-frequency magnetic field generated by the main solenoid coil.

Further, in accordance with the present invention, there is provided a probe for an NMR in which a solenoid coil is mounted, wherein the solenoid coil is structured such that a static magnetic field compensating member is arranged in such a manner as to extend a main solenoid coil in an axial direction, and the static magnetic field compensating member is structured such as not to generate a high-frequency magnetic field in such a direction as to cancel a high-frequency magnetic field generated by the main solenoid coil.

In the present invention, the static magnetic compensating member is constituted, for example, by a ring-shaped member formed by an insulant having a magnetic susceptibility of the same sign as a material of the main solenoid coil, and is arranged in such a manner as to come into contact with the main solenoid coil.

Further, in the present invention, the static magnetic field compensating member is constituted, for example, by a C-shaped ring, and is arranged separately in such a manner as not to come into contact with the main solenoid coil.

Further, in the present invention, the static magnetic field compensating member is constituted, for example, by a plurality of ring-shaped members divided in a circumferential direction, and is arranged separately in such a manner as not to come into contact with the main solenoid coil.

An NMR frequency of a whole of a sample comes to a fixed value by increasing the homogeneity of the static magnetic field in a sample space, a spectra line shape obtained by Fourier transform of the NMR signal becomes narrow, and a peak of a spectrum becomes high. In accordance with the present invention, since a measuring object region of the NMR signal is enlarged, it is possible to increase a sensitivity of the NMR signal.

The solenoid coil is structured by a line or a foil having a certain magnetic susceptibility, and is arranged in such a manner as to be as close as possible to a sample space, and a shape of the solenoid coil is generally formed in a cylindrical shape. A phenomenon that a static magnetic field intensity in the sample space is rapidly changed is caused by a generation of a difference of the magnetic susceptibility at a position where the cylinder is disconnected in an axial direction.

As a means for making the difference of the magnetic susceptibility small, there can be listed up making the magnetic susceptibility of the line or the foil constructing the solenoid coil small without limit. As a matter of fact, a clad wire or a clad foil (an aluminum-copper clad wire or the like) compounding two or more kinds of materials having different signs of magnetic susceptibility is available. However, even if a volume ratio of the materials is accurately controlled, there is a limit to minimize the magnetic susceptibility.

The present invention proposes a method of compensating the static magnetic field of the sample space, which is effective against the solenoid coil constructed by the wire or the foil in which the magnetic susceptibility is not zero.

In accordance with a first means, a ring-shaped member constituted by an insulant having the same sign as a magnetic susceptibility of a solenoid coil is arranged in an outer side in an axial direction of the solenoid coil in such a manner as to come into contact with the solenoid coil.

In accordance with a second means, a C-shaped member is arranged separately in an outer side in an axial direction of a solenoid in such a manner as not to come into contact with the solenoid coil.

In accordance with a third means, a plurality of ring-shaped members cut in a circumferential direction are arranged in an outer side in an axial direction of a solenoid coil in such a manner as not to come into contact with the solenoid coil.

The ring-shaped member, the C-shaped member and a plurality of ring-shaped members are hereinafter called as a static magnetic field compensating ring in all. The static magnetic field compensating ring in accordance with any one of the first means to the third means is magnetized by the static magnetic field, thereby compensating the static magnetic field of the solenoid coil sensitive area. The static magnetic field corresponds to a magnetic field which is essential for acquiring an NMR signal. Accordingly, it not necessary to freshly apply a second static magnetic field to the static magnetic field compensating ring, the static magnetic field compensating ring is arranged on the spot and brings out an effect by being consequently applied the static magnetic field.

In accordance with the first means mentioned above, since the static magnetic field compensating ring arranged in the outer side in the axial direction of the solenoid coil is constructed by the insulant, an electric current operating so as to narrow the sensitive area of the solenoid coil does not flow.

Further, in accordance with the second means, since the static magnetic field compensating ring is formed by a conductive material or the insulant, but any capacitor for resonance is not installed in an open portion of the C-shaped portion, the electric current operating so as to narrow the sensitive area of the solenoid coil does not flow even if the static magnetic field compensating ring is formed by the conductive material. In the case of being formed by the conductive material, the static magnetic field compensating ring is installed so as to be spaced at a fixed distance. Accordingly, a small amount of capacitance component (stray capacitance) exists in the open portion of the C-shaped portion. Therefore, the electric current operating so as to narrow the sensitive area of the solenoid coil may flow slightly. However, the capacitor is not positively arranged. This point is apparently different from the patent document 1.

The third means is structured such that the ring-shaped member is cut into a plurality of sections in the circumferential direction, for reducing the electric current which may flow in the second means.

Other objects, features and advantages of the invention will become apparent from the following description of the embodiments of the invention taken in conjunction with the accompanying drawings.

DETAILED DESCRIPTION OF THE INVENTION

A description will be given below of embodiments, however, the present invention is not limited to the following embodiments.

Embodiment 1

Figure 1A:
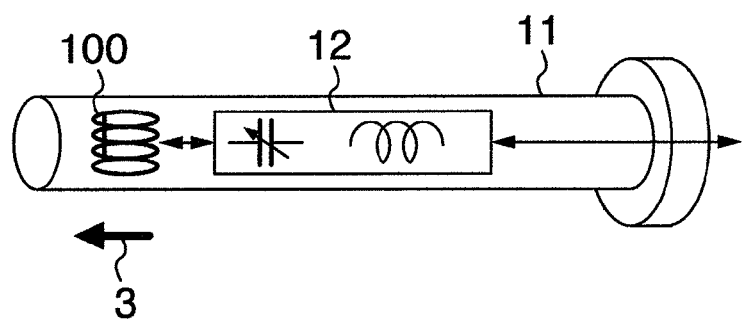
FIGS. 1A and 1B are schematic views of an outline structure of a probe for an NMR signal provided with a solenoid coil.
Figure 1B:
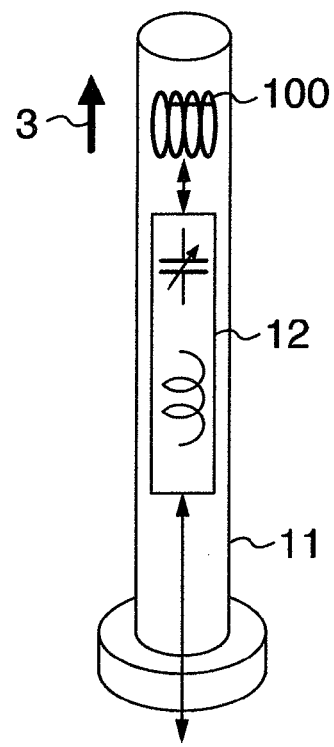

FIGS. 1A and 1B are explanatory views showing an example of a positional relation between a probe and a solenoid coil in an NMR signal acquiring apparatus. A direction of a static magnetic field is different between FIGS. 1A and 1B. A static magnetic field in a static magnetic field direction 3 is formed by a static magnetic field generating apparatus such as a superconducting magnet or the like. A solenoid coil 100 aimed by the present invention is constituted by a main solenoid coil and a static magnetic field compensating member which are not illustrated in this case, is mounted to a probe 11, and is arranged near a center of a static magnetic field in such a manner that a coil axis orthogonal to the static magnetic field direction 3. The main solenoid coil is compensated so as to resonate at a predetermined frequency, by a resonance circuit 12 arranged within the probe. The solenoid coil and the apparatus in an outer side of the probe exchange a high-frequency signal via a coaxial cable or the like through the resonance circuit. As shown in FIG. 1, a probe longer direction may come to a horizontal direction or a vertical direction in accordance with the direction of the static magnetic field direction 3.

Figure 2:
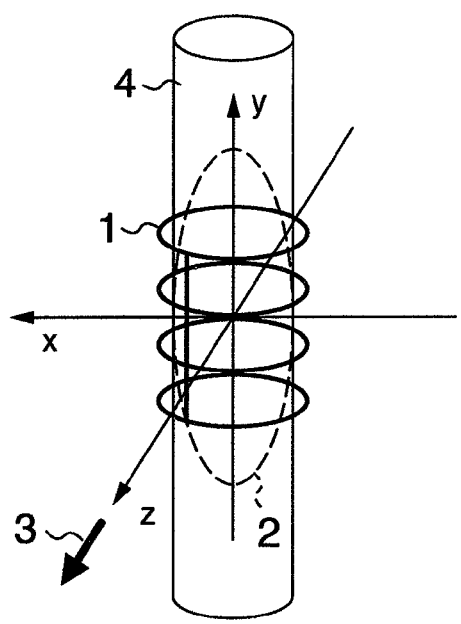
FIG. 2 is a view showing an example of a positional relation between a sample tube and the solenoid coil.

FIG. 2 is an explanatory view showing an example of a positional relation between a sample tube 4 and the solenoid coil in the NMR signal acquiring apparatus. In this case, only a main solenoid coil 1 is shown, and a static magnetic field compensating member is omitted. Since a direction of the static magnetic field is frequently expressed by z, an axial direction of the sample tube is frequently expressed by y, in an NMR system, a coordinate axis in FIG. 2 is based on this. A sensitive area of the main solenoid coil 1 protrudes and expands in a coil axial direction than both ends of the main solenoid coil as shown in FIG. 2.

Figure 3:
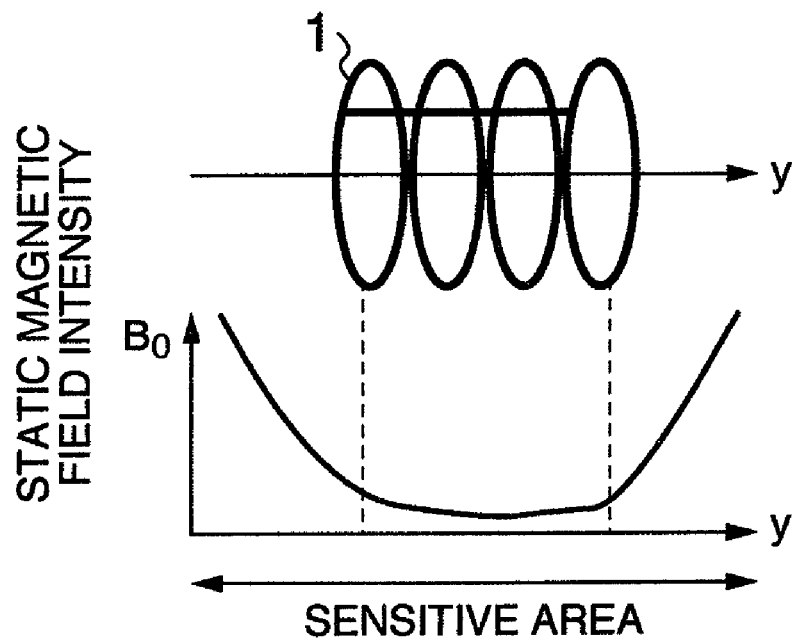
FIG. 3 is a view showing a static magnetic field intensity distribution in the case that a static magnetic field compensating member is not provided.
Figure 4:
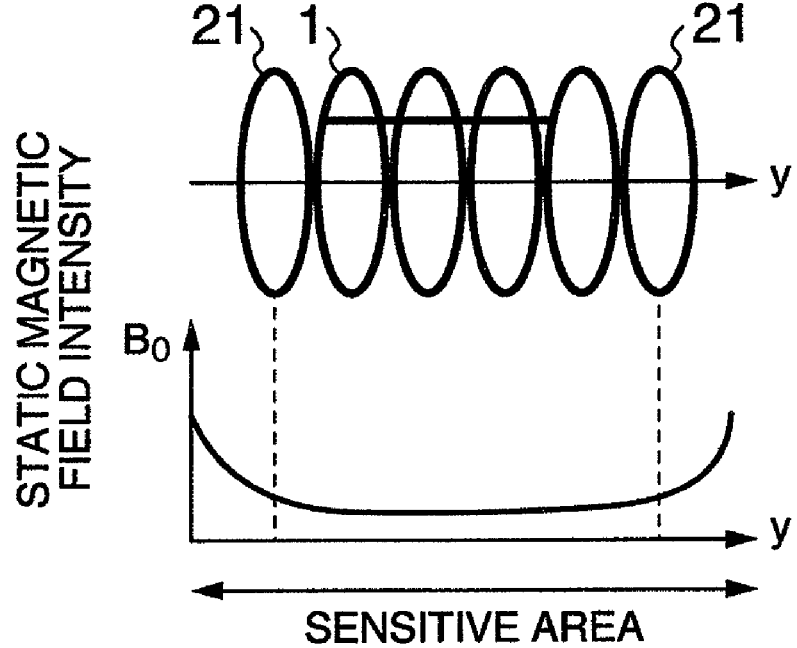
FIG. 4 is a view showing the static field magnetic intensity distribution in the case of applying the present invention.

FIGS. 3 and 4 are views comparing effects of the present invention. FIG. 3 shows a case that the static magnetic field compensating member is not arranged. In the case of being constituted only by the main solenoid coil without arranging the static magnetic field compensating member, a static magnetic field intensity is a fixed value near a center of the main solenoid coil 1 as shown in FIG. 3, however, is not fixed as being closer to both ends. This is based on a knowledge of an electromagnetism that a magnetic field intensity within an infinite cylinder placed in the static magnetic field is constant, but the magnetic field intensity is not constant as being closer to an end portion within a cylinder having a finite length.

FIG. 4 shows a case that a static magnetic field compensating ring 21 is provided in an outer side in an axial direction of the main solenoid coil 1. A solenoid coil 100 is constructed by combining the main solenoid coil and the static magnetic field compensating member. Since to arrange the static magnetic field compensating ring 21 in the outer side in the axial direction of the main solenoid coil 1 deserves to elongate the length of the cylinder having the finite length in the coil axial direction, a point at which the magnetic field intensity starts changing moves to an outer side in the coil axial direction. As a result, a homogeneity of the static magnetic field is improved in the sensitive area of the main solenoid coil 1. A magnetic field distribution generated by the static magnetic field compensating ring 21 being magnetized is in proportion to a product of a susceptibility per volume of a material constituting the static magnetic field compensating ring 21 and a volume. Accordingly, it is not necessary that the susceptibility per volume of the material constituting the static magnetic field compensating ring 21 is necessarily identical to the susceptibility per volume of the solenoid coil, and it is sufficient that they have the same sign.

Figure 5A:
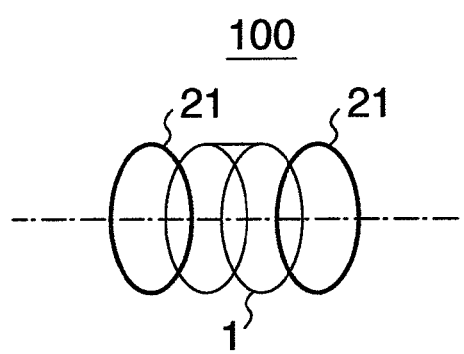
FIGS. 5A and 5B are brief views and three-dimensional views of a solenoid coil in accordance with an embodiment 1.
Figure 5B:
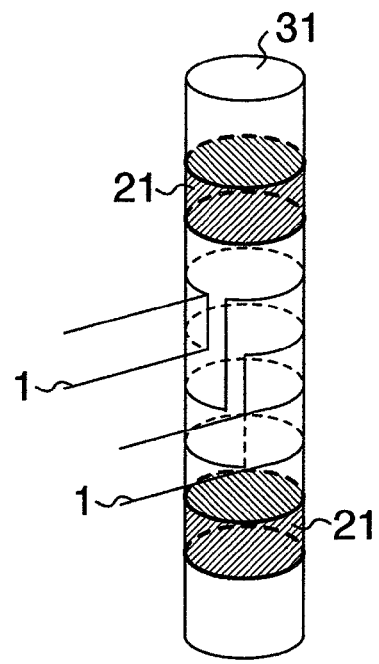

FIG. 5A is a brief view and FIG. 5B is a three-dimensional view showing one example of a first means, in the case that the static magnetic field compensating ring 21 is placed one turn by one turn in both ends of the main solenoid coil 1 which is wound at two turns step by step. In the three-dimensional view of FIG. 5B, a hatched part corresponds to the static magnetic field compensating ring 21. A manufacturing example will be shown below. At a time of manufacturing the main solenoid coil 1 by using the copper and aluminum composite material mentioned above, in the case that the material has a negative magnetic susceptibility although being small, it is preferable to manufacture the static magnetic field compensating ring 21 by applying a material having the same negative magnetic susceptibility, for example, a polyimide varnish or the like to a bobbin 31. On the contrary, in the case that the material constructing the main solenoid coil has a positive magnetic susceptibility per volume, the static magnetic field compensating ring 21 can be manufactured by mixing a material having a positive susceptibility, for example, an aluminum nitride or the like to the polyimide varnish so as to apply. An applying amount can be calculated by the susceptibility per volume of the material constructing the main solenoid coil 1 and the susceptibility per volume of the applied material. In the case that it is unknown, the applying amount may be compensated by applying little by little and observing an effect of the static magnetic field compensation obtained by actually acquiring the NMR signal.

Embodiment 2

Figure 6A:
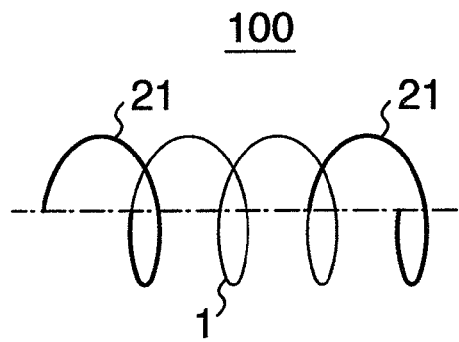
FIGS. 6A and 6B are brief views and three-dimensional views of a solenoid coil in accordance with an embodiment 2.
Figure 6B:
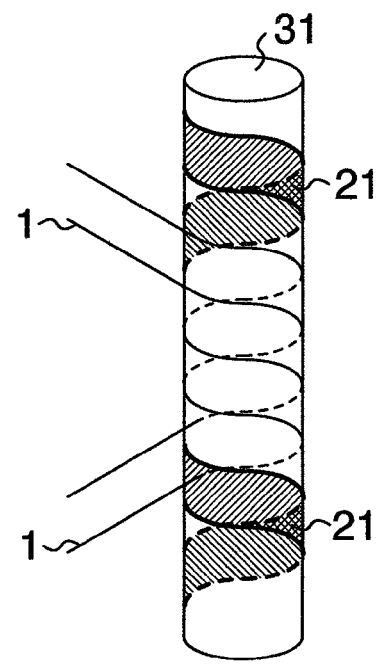

FIG. 6A is a brief view and FIG. 6B is a three-dimensional view showing one example of a second means, in the case that the static magnetic field compensating ring 21 is placed one turn by one turn in both ends of the main solenoid coil 1 which is wound at two turns spirally, by the same material on an extension of both ends. In the three-dimensional view of FIG. 6B, a hatched part corresponds to the static magnetic field compensating ring 21. In the case of the second means, the static magnetic field compensating ring 21 can be formed by the conductive material or the insulant, however, if it is made of the same material as the main solenoid coil, it is unnecessary to compensate the magnetic susceptibility. Accordingly, there is obtained an advantage that it is easy to manufacture.

Embodiment 3

Figure 7:
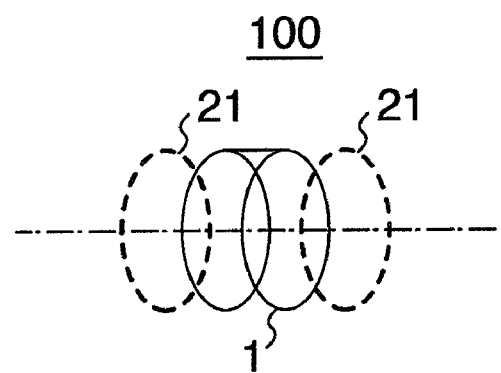
FIG. 7 is a brief view of a solenoid coil in accordance with an embodiment 3.

FIG. 7 is a brief view showing one example of a third means, in the case that the static magnetic field compensating rings 21 made of the same material but divided in a circumferential direction are placed one turn by one turn in both ends of the main solenoid coil 1 which is wound at two turns step by step, so as to be spaced at the same distance as the winding interval of the main solenoid coil 1 from the end portion of the main solenoid coil.

Embodiment 4

Figure 8:
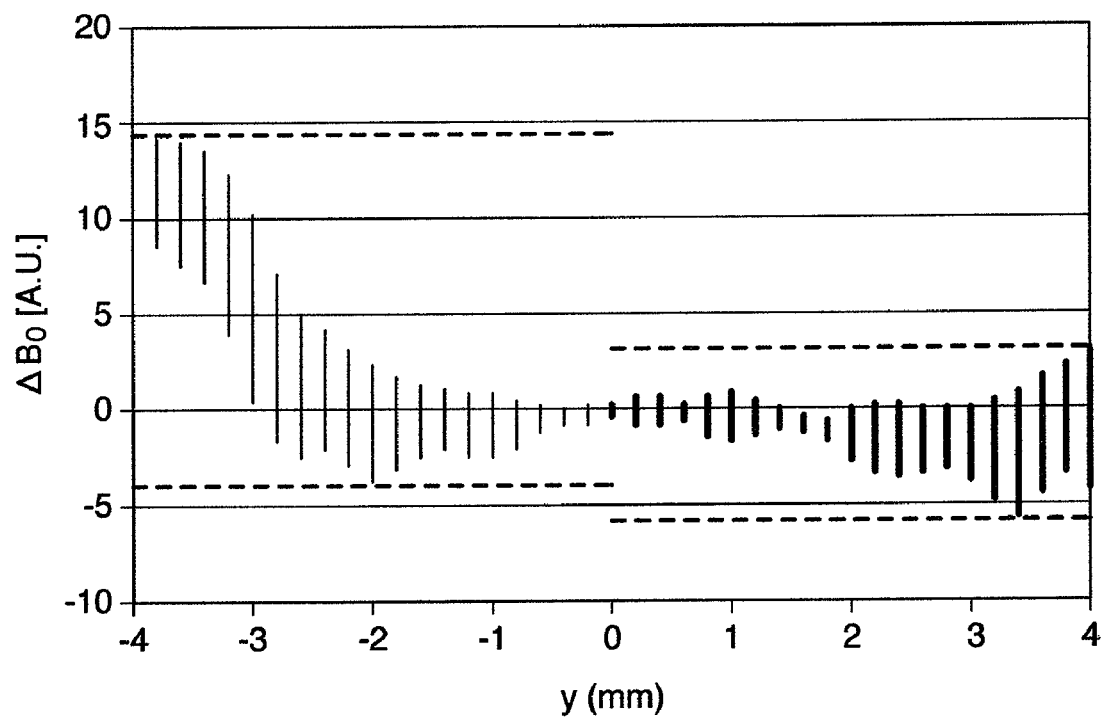
FIG. 8 is a view showing an effect of the present invention determined by a calculation.

FIG. 8 is one example of a result of calculation expressing an effect of the present invention. A horizontal axis indicates a length in a coil axial direction, and a vertical axis indicates a displacement from the static magnetic field intensity of a coil center. A left half corresponds to a case that the static magnetic field compensating member is not provided, and indicates the static field magnetic field distribution on φ4.2 mm in the solenoid coil in which a tape-like wire rod having a line width 1.4 mm is wound at five turns in a spiral shape having φ6.4 mm and a pitch 1.4 mm. A right half indicates the static magnetic field distribution in a case of adding one turn of static magnetic field compensating ring by the same material in both ends of the same solenoid coil. Positions at ±4 mm in the y axis correspond to both ends of the main solenoid coil, however, it is known that the static magnetic field intensity distribution near both ends of the main solenoid coil is suppressed to about one half by the static magnetic field compensating ring.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A solenoid coil for an NMR signal used for sending a high-frequency wave, receiving or sending and receiving in a measurement of an NMR signal, wherein the solenoid coil comprising: a main solenoid coil and a static magnetic field compensating member which is arranged on the both ends of the main solenoid coil to form one combination structure is at least one of: (a) arranged to extend said main solenoid coil in an axial direction, and not to generate a high-frequency magnetic field in a direction as to cancel a high-frequency magnetic field generated by said main solenoid coil; and (b) constituted by an insulant having a magnetic susceptibility of the same sign as a material of a main solenoid coil and is arranged in an outer side in an axial direction of the main solenoid to contact with said main solenoid coil.

2. A solenoid coil for an NMR signal as claimed in claim 1, wherein said static magnetic field compensating member is arranged to extend said main solenoid coil in the axial direction, and said static magnetic field compensating member is structured not to generate a high-frequency magnetic field in a direction as to cancel a high-frequency magnetic field generated by said main solenoid coil.

3. A solenoid coil for an NMR signal as claimed in claim 1, wherein said static magnetic field compensating member has at least partially a ring-shape.

4. A solenoid coil for an NMR signal as claimed in claim 3, wherein said static magnetic field compensating member is arranged in an outer side of an axial direction of said main solenoid coil.

5. A probe for an NMR comprising: a mounted solenoid coil having a main solenoid coil and a static magnetic field compensating member arranged on the both ends of the main solenoid coil to extend a main solenoid coil in an axial direction form one combination structure is at least one of: (a) structured not to generate a high-frequency magnetic field in a direction as to cancel a high-frequency magnetic field generated by said main solenoid coil; and (b) constituted by an insulant having a magnetic susceptibility of the same sign as a material of a main solenoid coil and is arranged in an outer side in an axial direction of the main solenoid to contact with said main solenoid coil.

6. A probe for an NMR as claimed in claim 5, wherein said static magnetic field compensating member is arranged to extend said main solenoid coil in the axial direction, and said static magnetic field compensating member is structured not to generate a high-frequency magnetic field in a direction as to cancel a high-frequency magnetic field generated by said main solenoid coil.

7. A probe for an NMR as claimed in claim 5, wherein said static magnetic field compensating member is arranged at least in an outer side of an axial direction of said main solenoid coil and has at least partially a ring-shape.

* * * * *